United States Patent
Wang et al.

(10) Patent No.: US 11,967,953 B2
(45) Date of Patent: Apr. 23, 2024

(54) NON-VOLATILE BOOLEAN LOGIC CIRCUIT BASED ON MEMRISTORS AND OPERATION METHOD THEREOF

(71) Applicant: HUAZHONG UNIVERSITY OF SCIENCE AND TECHNOLOGY, Hubei (CN)

(72) Inventors: Xingsheng Wang, Hubei (CN); Yujie Song, Hubei (CN); Qiwen Wu, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 138 days.

(21) Appl. No.: 17/794,620

(22) PCT Filed: Jul. 5, 2021

(86) PCT No.: PCT/CN2021/104578
§ 371 (c)(1),
(2) Date: Jul. 22, 2022

(87) PCT Pub. No.: WO2022/262017
PCT Pub. Date: Dec. 22, 2022

(65) Prior Publication Data
US 2023/0170908 A1    Jun. 1, 2023

(30) Foreign Application Priority Data

Jun. 16, 2021   (CN) .......................... 202110664754.7

(51) Int. Cl.
*H03K 19/173*     (2006.01)
*G11C 13/00*      (2006.01)
(Continued)

(52) U.S. Cl.
CPC ....... *H03K 19/1776* (2013.01); *G11C 13/004* (2013.01); *G11C 13/0069* (2013.01); *H03K 19/21* (2013.01)

(58) Field of Classification Search
CPC .............. G11C 13/004; G11C 13/0069; H03K 19/1776; H03K 19/21
See application file for complete search history.

(56) References Cited

U.S. PATENT DOCUMENTS 10,171,083 B2 *  1/2019  Swartzlander ..... G11C 13/0069
10,847,577 B2 * 11/2020  Choi .................... H10N 70/881
(Continued)

FOREIGN PATENT DOCUMENTS

| CN | 104124960 | 10/2014 |
|----|-----------|---------|
| CN | 109994139 | 7/2019  |

(Continued)

OTHER PUBLICATIONS

"International Search Report (Form PCT/ISA/210) of PCT/CN2021/104578," dated Mar. 16, 2022, pp. 1-4.
(Continued)

*Primary Examiner* — Kurtis R Bahr
(74) *Attorney, Agent, or Firm* — JCIPRNET

(57) ABSTRACT

A non-volatile Boolean logic circuit based on memristors and an operation method, which performs logic operations on the input logic value P and/or the input logic value Q. The logic circuit includes: a controller, a memristor M1, a memristor M2 and a resistor. The controller sets the memristor M2 to a high resistance state before performing the logic operation. When performing the logic operation, a voltage A is applied to the memristor M1, a voltage B is applied to the memristor M2, a voltage C is applied to the resistor. The resistance state of the memristor M2 is the result of the logic operation. When a logic operation is
(Continued)

performed on the logic value P and the logic value Q or only on the logic value Q, the controller further sets the memristor M1 to the resistance state corresponding to the logic value Q before performing the logic operation.

9 Claims, 4 Drawing Sheets

(51) Int. Cl.
*H03K 19/1776* (2020.01)
*H03K 19/21* (2006.01)

(56) References Cited

U.S. PATENT DOCUMENTS

| | | | |
|---|---|---|---|
| 10,860,291 B2* | 12/2020 | Jabir | H03K 19/20 |
| 11,189,345 B2* | 11/2021 | Liu | G11C 13/0069 |
| 2016/0020766 A1* | 1/2016 | Miao | H03K 19/0021 326/37 |
| 2017/0316309 A1* | 11/2017 | Di Ventra | G06N 3/063 |
| 2018/0367149 A1* | 12/2018 | Kvatinsky | H03K 19/20 |
| 2020/0194066 A1* | 6/2020 | Naous | G11C 13/0021 |

FOREIGN PATENT DOCUMENTS

| | | |
|---|---|---|
| CN | 110362291 | 10/2019 |
| CN | 111061454 | 4/2020 |

OTHER PUBLICATIONS

"Written Opinion of the International Searching Authority (Form PCT/ISA/237) of PCT/CN2021/104578," dated Mar. 16, 2022, pp. 1-4.

Julien Borghetti et al., "Memristive' switches enable 'stateful' logic operations via material implication," Nature, vol. 464, Apr. 2010, pp. 873-876.

* cited by examiner

| Logic function | $T_1$ (A) | $T_3$ (C) |
|---|---|---|
| TRUE | $-V_p$ | $-V_p$ |
| FALSE | 0 | 0 |
| COPY P | $-V$ | $-V$ |
| COPY Q | $-V_p$ | 0 |
| NOT P | $V-V_p$ | $V-V_p$ |
| NOT Q | 0 | $-V_p$ |
| AND | $-V$ | 0 |
| NAND | $V-V_p$ | $-V_p$ |
| OR | $-V_p$ | $-V$ |
| NOR | 0 | $V-V_p$ |
| IMP | $-V_p$ | $V-V_p$ |
| RIMP | $-V$ | $-V_p$ |
| NIMP | 0 | $-V$ |
| RNIMP | $V-V_p$ | 0 |
| XOR | $V-V_p$ | $-V$ |
| XNOR | $-V$ | $V-V_p$ |

FIG. 3

| P | Q | Result |
|---|---|--------|
| 0 | 0 | 0 |
| 0 | 1 | 1 |
| 1 | 0 | 1 |
| 1 | 1 | 0 |

NON-VOLATILE BOOLEAN LOGIC CIRCUIT BASED ON MEMRISTORS AND OPERATION METHOD THEREOF

CROSS-REFERENCE TO RELATED APPLICATION

This application is a 371 of international application of PCT application serial no. PCT/CN2021/104578, filed on Jul. 5, 2021, which claims the priority benefit of China application no. 202110664754.7, filed on Jun. 16, 2021. The entirety of each of the above-mentioned patent applications is hereby incorporated by reference herein and made a part of this specification.

TECHNICAL FIELD

The disclosure belongs to the technical field of microelectronic devices, and more particularly, relates to a non-volatile Boolean logic circuit based on memristors and an operation method thereof.

DESCRIPTION OF RELATED ART

Nowadays, computers operate mainly based on von Neumann architecture. In this architecture, data is fetched from a memory unit and transmitted to a processing unit. After the computing is finished, the data is transmitted to the memory unit in which the data is to be stored. Currently, the operation speed of the memory has achieved a high level, but there is still a large gap in the transmission speed of the bus connecting the two units, and the frequent data transmission consumes most of the time and power in the data processing. The problem of rate mismatch limits the development of existing computers, and the problem is called the memory wall. In-memory computing is a very promising solution. Similar to the human brain, storing and computing coexist in memory, which has the advantages of high computing parallelism, low latency, and low power consumption.

As one of the new types of memory devices, the memristor is a powerful candidate for in-memory computing architecture because of its non-volatility in nature, which allows the memristor to maintain a resistance state even after power is removed. The logic computing based on memristor is mainly divided into three categories. In the first type of implementation method, the input and output are expressed in the form of the resistance state of the memristor. This kind of scheme is preferable in the case where the logic cascade is performed but the number of devices and the steps of operation needed are large. Furthermore, the number of devices and the operational complexity increases for complex logical operations such as XOR/NAND, etc. In the second type of implementation method, the input is applied to both ends of the memristor in the form of voltage, and the output is expressed with resistance state. In this type of scheme, the number of devices adopted is significantly reduced, and operation steps are also decreased, but the logic cascade has to be subjected to a process of digital-to-analog signal conversion, which reduces the operation efficiency. In the third type of method, the input is the voltage applied at one end of the memristor and the initial resistance value of the memristor, the output is expressed in the form of the resistance state of this memristor. Such a method requires fewer devices and operation steps, and it is easy to perform cascade logic. However, this kind of logic operation is a destructive operation, making it difficult to protect the integrity of input information. Therefore, it is necessary to propose a logically integrated implementation scheme, which is easy to implement logical cascade without destroying the integrity of input data while using as few devices and operation steps as possible.

SUMMARY

In view of the above defects or requirements for improvement of the conventional technology, the present disclosure provides a non-volatile Boolean logic circuit based on memristors and an operation method thereof, which are used to solve the technical problem of conventional technology which is unable to realize integrated Boolean logic operations with a relatively small number of devices and operation steps at high operation efficiency.

In order to achieve the above purpose, in the first aspect, the present disclosure provides a non-volatile Boolean logic circuit based on memristors, which is used to perform logic operations on the input logic value P and/or the input logic value Q.

The above logic circuit includes: a controller, a memristor $M_1$, a memristor $M_2$ and a resistor.

The controller is connected to the positive electrode of the memristor $M_1$, the positive electrode of the memristor $M_2$ and one end of the resistor respectively. The negative electrode of the memristor $M_1$ and the memristor $M_2$ are connected to the same word line. The other end of the resistor is connected to the word line. The memristor $M_1$ and the memristor $M_2$ are the same.

The controller is used to set the memristor $M_2$ to a high resistance state before performing the logic operation. When performing the logic operation, a voltage A is applied to the memristor $M_1$, a voltage B is applied to the memristor $M_2$, a voltage C is applied to the resistor, and the resistance state of the memristor $M_2$ is read, thereby obtaining the result of the logic operation.

When the above-mentioned logic circuit performs the operation related to the logic value Q, the controller is further used to set the memristor $M_1$ to the resistance state corresponding to the logic value Q before performing the logic operation. The operation related to the logic value Q includes performing the logic operation on logic value P and logic value Q or performing logic operation only on logic value Q.

The value of voltage A and voltage C is determined based on the logic value P and the type of logic operation. The value of voltage B is $V_p$; $V_p$ satisfies $V_{set}/2 < V_p < V_{set}$ and $V_p < 2|V_{reset}|$; $V_{set}$ is a threshold value at which the memristor $M_1$ or the memristor $M_2$ changes from a high resistance state to a low resistance state; $V_{reset}$ is a threshold value at which the memristor $M_1$ or the memristor $M_2$ changes from a low resistance state to a high resistance state.

More preferably, the memristor $M_1$ and the memristor $M_2$ both include a high resistance state and a low resistance state; the high resistance state corresponds to a logic value "0", and the low resistance state corresponds to a logic value "1".

More preferably, the resistance value of the resistor is in a range between resistance values of the memristor $M_1$ or the memristor $M_2$ in the high resistance state and the low resistance state; the resistance value of the resistor is $R = \sqrt{R_H * R_L}$, and $R_H$ is statistical average resistance values of the memristor $M_1$ and the memristor $M_2$ in the high resistance state, and $R_L$ is statistical average resistance values of the memristor $M_1$ and the memristor $M_2$ in the low resistance state.

More preferably, the controller includes a control terminal $T_1$, a control terminal $T_2$ and a control terminal $T_3$; the control terminal $T_1$ is connected to the positive electrode of the memristor $M_1$, the control terminal $T_2$ is connected to the positive electrode of the memristor $M_2$, and the control terminal $T_3$ is connected to one end of the resistor.

When the controller performs logic operations, a voltage A is applied to the memristor $M_1$ through the control terminal $T_1$, a voltage B is applied to the memristor $M_2$ through the control terminal $T_2$, a voltage C is applied to the resistor through the control terminal $T_3$, and the resistance state of the memristor $M_2$ is read, thereby obtaining the result of the logic operation.

More preferably, the types of logic operations include: true logic operation, false logic operation, P logic operation, Q logic operation, not-P logic operation, not-Q logic operation, AND logic operation, NAND logic operation, OR logic operation, NOR logic operation, material implication logic operation, inverse material implication logic operation, negative material implication logic operation, inverse negative material implication logic operation, XOR logic operation, and XNOR logic operation.

More preferably, when the type of logic operation is true logic operation, the value of voltage A is $-V_p$, and the value of voltage C is $-V_p$.

When the type of logic operation is false logic operation, the value of voltage A is 0, and the value of voltage C is 0.

When the type of logic operation is P logic operation, the value of voltage A is $-V$, and the value of voltage C is $-V$.

When the type of logic operation is Q logic operation, the value of voltage A is $-V_p$, and the value of voltage C is 0.

When the type of logic operation is not-P logic operation, the value of voltage A is $V-V_p$, and the value of voltage C is $V-V_p$.

When the type of logic operation is not-Q logic operation, the value of voltage A is 0, and the value of voltage C is $-V_p$.

When the type of logic operation is AND logic operation, the value of voltage A is $-V$, and the value of voltage C is 0.

When the type of logic operation is NAND logic operation, the value of voltage A is $V-V_p$, and the value of voltage C is $-V_p$.

When the type of logic operation is OR logic operation, the value of voltage A is $-V_p$, and the value of voltage C is $-V$.

When the type of logic operation is NOR logic operation, the value of voltage A is 0, and the value of voltage C is $V-V_p$.

When the type of the logic operation is material implication logic operation, the value of voltage A is $-V_p$, and the value of voltage C is $V-V_p$.

When the type of logic operation is inverse material implication logic operation, the value of voltage A is $-V$, and the value of voltage C is $-V_p$.

When the type of logic operation is negative material implication logic operation, the value of voltage A is 0, and the value of voltage C is $-V$.

When the type of logic operation is inverse negative material implication logic operation, the value of voltage A is $V-V_p$, and the value of voltage C is 0.

When the type of logic operation is XOR logic operation, the value of voltage A is $V-V_p$, and the value of voltage C is $-V$.

When the type of logic operation is XNOR operation, the value of voltage A is $-V$, and the value of voltage C is $V-V_p$.

When the logic value P is 0, the value of V is 0; when the logic value P is 1, the value of V is $V_p$.

In a second aspect, an operation method based on the above-mentioned non-volatile Boolean logic circuit includes the following steps.

S1. Setting the memristor $M_2$ to a high resistance state;

S2. Determining whether the current operation is an operation related to the logic value Q, and if so, setting the memristor $M_1$ to the resistance state corresponding to the logic value Q; and the operation related to the logic value Q includes performing logic operations on the logic value P and the logic value Q and performing logic operation only on the logic value Q;

S3. Applying a voltage A to the memristor $M_1$, applying a voltage B to the memristor $M_2$, applying a voltage C to the resistor, and reading a resistance state of the memristor $M_2$, thereby obtaining the result of the logic operation.

The value of voltage A and voltage C is determined based on the logic value P and the type of logic operation. The value of voltage B is $V_p$; $V_p$ satisfies $V_{set}/2<V_p<V_{set}$ and $V_p<2|V_{reset}|$; $V_{set}$ is a threshold value at which the memristor $M_1$ or the memristor $M_2$ changes from a high resistance state to a low resistance state; $V_{reset}$ is a threshold value at which the memristor $M_1$ or the memristor $M_2$ changes from a low resistance state to a high resistance state.

More preferably, when the type of logic operation is true logic operation, the value of voltage A is $-V_p$, and the value of voltage C is $-V_p$.

When the type of logic operation is false logic operation, the value of voltage A is 0, and the value of voltage C is 0.

When the type of logic operation is P logic operation, the value of voltage A is $-V$, and the value of voltage C is $-V$.

When the type of logic operation is Q logic operation, the value of voltage A is $-V_p$, and the value of voltage C is 0.

When the type of logic operation is not-P logic operation, the value of voltage A is $V-V_p$, and the value of voltage C is $V-V_p$.

When the type of logic operation is not-Q logic operation, the value of voltage A is 0, and the value of voltage C is $-V_p$.

When the type of logic operation is AND logic operation, the value of voltage A is $-V$, and the value of voltage C is 0.

When the type of logic operation is NAND logic operation, the value of voltage A is $V-V_p$, and the value of voltage C is $-V_p$.

When the type of logic operation is OR logic operation, the value of voltage A is $-V_p$, and the value of voltage C is $-V$.

When the type of logic operation is NOR logic operation, the value of voltage A is 0, and the value of voltage C is $V-V_p$.

When the type of the logic operation is material implication logic operation, the value of voltage A is $-V_p$, and the value of voltage C is $V-V_p$.

When the type of logic operation is inverse material implication logic operation, the value of voltage A is $-V$, and the value of voltage C is $-V_p$.

When the type of logic operation is negative material implication logic operation, the value of voltage A is 0, and the value of voltage C is $-V$.

When the type of logic operation is inverse negative material implication logic operation, the value of voltage A is $V-V_p$, and the value of voltage C is 0.

When the type of logic operation is XOR logic operation, the value of voltage A is $V-V_p$, and the value of voltage C is $-V$.

When the type of logic operation is XNOR operation, the value of voltage A is $-V$, and the value of voltage C is $V-V_p$.

When the logic value P is 0, the value of V is 0; when the logic value P is 1, the value of V is $V_p$.

In a third aspect, a logic cascading method based on the above-mentioned non-volatile Boolean logic circuit includes the following steps.

The previous logic operation result obtained by the operation method described in the second aspect is taken as a new input logic value Q, the operation is performed again according to the operation method described in the second aspect, thereby realizing the logic cascade.

In general, through the above technical solutions conceived by the present disclosure, the following advantageous effects may be achieved.

1. The present disclosure provides a non-volatile Boolean logic circuit based on memristors and an operation method, which are used to perform logic operations on the input logic value P and/or the input logic value Q. The logic circuit is mainly composed of memristors and a resistor, has a simple structure, low circuit complexity and small circuit area. Specifically, the logic value P is defined in the form of voltage at the voltage input terminals of the memristor $M_1$ and the resistor, and the logic value Q is defined as the resistance state of the memristor $M_1$, and the resistance state of the memristor $M_2$ is used as the output. It is only required to set the memristor and bias the memristor and the resistor in two steps to achieve an integrated Boolean logic function. In this manner, an integrated Boolean logic operation can be realized with high operation efficiency under the condition of fewer devices and operation steps.

2. With the non-volatile Boolean logic circuit and operation method provided by the present disclosure, during the process of logic operation, the resistance state of the memristor $M_1$ does not change, and the whole operation process is non-destructive, so the integrity of input information can be protected.

3. The present disclosure provides a logic cascading method based on a non-volatile Boolean logic circuit based on memristors, which may directly use the result obtained by the logic operation in the previous step as the input of the logic operation in the next step, that is, the memristor $M_2$ which stores the operation result in the previous step is directly regarded as the input memristor $M_1$ of the subsequent logic operation, and the logic cascade is simple and easy to implement, which is helpful to realize more complex logic functions.

BRIEF DESCRIPTION OF THE DRAWINGS

FIG. 3 is a configuration diagram of a control terminal when performing 16 types of logic operations in Embodiment 1 of the present disclosure.

DESCRIPTION OF THE EMBODIMENTS

In order to make the purpose, technical solutions and advantages of the present disclosure clearer, the present disclosure will be further described in detail below with reference to the accompanying drawings and embodiments. It should be understood that the embodiments described herein are only used to explain the present disclosure, but not to limit the present disclosure. In addition, the technical features involved in the various embodiments of the present disclosure described below can be combined with each other as long as there is no conflict with each other.

Embodiment 1

A non-volatile Boolean logic circuit based on memristors for performing logic operations on an input logic value P and/or an input logic value Q.

Figure 1:
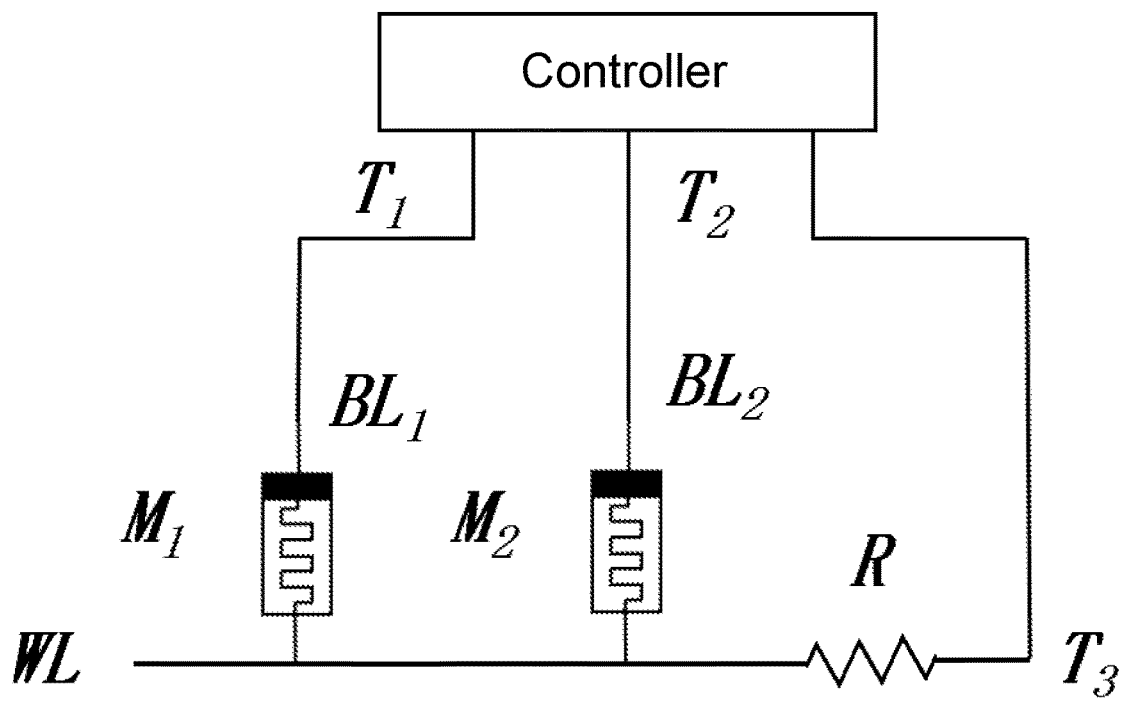
FIG. 1 is a schematic diagram of a non-volatile Boolean logic circuit based on a memristor in Embodiment 1 of the present disclosure.

As shown in FIG. 1, the above-mentioned logic circuit includes: a controller, a memristor $M_1$, a memristor $M_2$ and a resistor (the resistor with fixed resistance is used in this embodiment).

Figure 2:
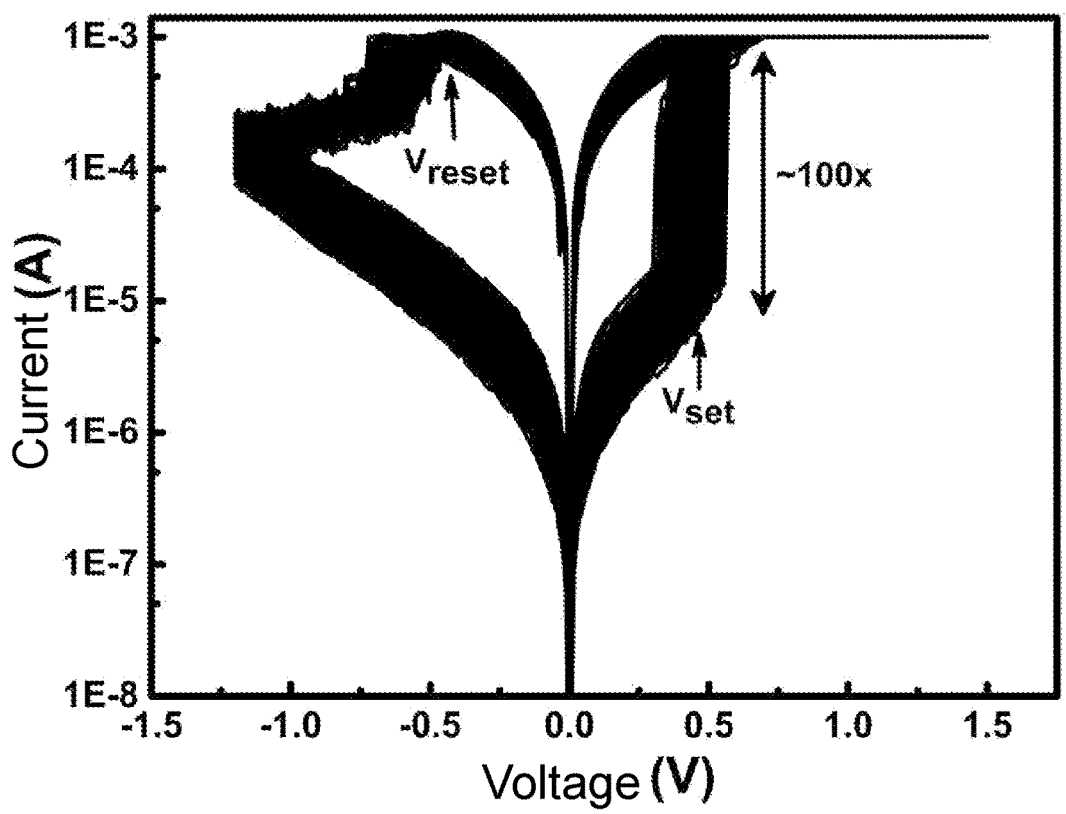
FIG. 2 is a I-V characteristic test diagram demonstrating the resistance-change of a memristor in Embodiment 1 of the present disclosure.

The controller is connected to the positive electrode of the memristor $M_1$, the positive electrode of the memristor $M_2$ and one end of the resistor respectively. The positive electrodes of the memristor $M_1$ and the memristor $M_2$ are connected to different bit lines respectively. The negative electrodes of the memristor $M_1$ and the memristor $M_2$ are connected to the same word line WL. The other end of the resistor is connected to the word line WL. The memristor $M_1$ and the memristor $M_2$ are the same. Specifically, the controller includes a control terminal $T_1$, a control terminal $T_2$ and a control terminal $T_3$; the control terminal $T_1$ is connected to the positive electrode of the memristor $M_1$ through the bit line $BL_1$, the control terminal $T_2$ is connected to the positive electrode of the memristor $M_2$ through the bit line $BL_2$, and the control terminal $T_3$ is connected to one end of the resistor. It should be noted that the above-mentioned memristor $M_1$ is the same as the memristor $M_2$, and both include a high resistance state and a low resistance state; the high resistance state corresponds to the logic value "0", and the low resistance state corresponds to the logic value "1". The characteristic test diagram of the resistance-change I-V of the adopted memristor is shown in FIG. 2. Specifically, when a forward voltage greater than $V_{set}$ is applied to both ends of the memristor, the resistance state of the memristor changes from a high resistance state to a low resistance state, and the resistance of the memristor is set to a low resistance state. When a negative voltage less than $V_{reset}$ is applied at both ends of the memristor, the resistance state of the memristor changes from a low resistance state to a high resistance state, and the resistance of the memristor is set to a high resistance state. By controlling the voltage at both ends of the memristor, the resistance state of the memristor may be switched between a high resistance state and a low resistance state. It is defined that the high resistance state of the memristor corresponds to the logic value "0", and the low resistance state of the memristor corresponds to the logic value "1". $V_{set}$ is a threshold value at which the memristor $M_1$ or the memristor $M_2$ changes from a high resistance state to a low resistance state. $V_{reset}$ is a threshold value at which the memristor $M_1$ or the memristor $M_2$ changes from a low resistance state to a high resistance state.

It should be noted that, in order to prevent the memristor from being broken down due to the applied forward voltage being too large, and the device that is broken down is unable to restore to the high resistance state by applying a negative reset voltage, when a forward voltage greater than $V_{set}$ is applied at both ends of the memristor to change the resistance state of the memristor from a high resistance state to a low resistance state, the memristor is current-limited, and the amplitude for current-limiting is $I_{cc}$. Specifically, as shown in FIG. 2, this embodiment sets the amplitude for the current-limiting of the adopted memristor to 1 mA, i.e., $I_{cc}$ is 1 mA.

The controller is used to set the memristor $M_2$ to a high resistance state before performing the logic operation. When performing the logic operation, a voltage A is applied to the memristor $M_1$, a voltage B is applied to the memristor $M_2$, a voltage C is applied to the resistor, and the resistance state of the memristor $M_2$ is read, thereby obtaining the result of the logic operation.

When the above-mentioned logic circuit performs the operation related to the logic value Q, the controller is further used to set the memristor $M_1$ to the resistance state corresponding to the logic value Q before performing the logic operation. The operation related to the logic value Q includes performing the logic operation on logic value P and logic value Q and performing logic operation only on logic value Q.

The value of voltage A and voltage C is determined based on the logic value P and the type of logic operation. The value of voltage B is $V_p$. Since the electrical signals adopted in the logic operation process are all voltage pulse signals, in order to meet the requirements of the logic operation, the voltage amplitude of $V_p$ should be set between $V_{set}/2$ and $V_{set}$, so that when the operation is not performed, the memristor that is originally in a high resistance state is not changed to a low resistance state. Meanwhile, when a voltage drop of $2V_p$ is added at both ends of the memristor, it is ensured that the resistance state of the memristor will change. In addition, it is also necessary to satisfy $V_p<2|V_{reset}|$, so that when no operation is performed, the memristor that is originally in a low resistance state is not changed to a high resistance state. Therefore, $V_p$ needs to satisfy $V_{set}/2<V_p<V_{set}$ and $V_p<2|V_{reset}|$.

Further, in order to clearly distinguish the low resistance state and high resistance state of the memristor and the resistance value of the fixed-value resistor, the memristor that on/off ratio is greater than or equal to the preset on/off threshold is adopted. In this embodiment, the preset on/off threshold value is 100. The resistance value of the resistor is between the resistance values of the memristor M1 or the memristor M2 in the high resistance state and the low resistance state. Since the high resistance state and the low resistance state of the memristor are in different orders of magnitude, in order to further distinguish the low resistance state and high resistance state of the memristor and the resistance value of the fixed-value resistor, preferably, the resistance value of the fixed-value resistor is $R=\sqrt{R_H*R_L}$, and $R_H$ is statistical average resistance values of the memristor $M_1$ and the memristor $M_2$ in the high resistance state, and $R_L$ is statistical average resistance values of the memristor $M_1$ and the memristor $M_2$ in the low resistance state. The fixed-value resistor mainly plays the role of current limiting the logic circuit. Further, considering that the resistance values of the memristor in both the high resistance state and the low resistance state are in a certain range, the resistance value R of the fixed-value resistor may be set to be slightly larger than $\sqrt{R_H*R_L}$, so as to better ensure the reliability of the circuit.

It should be indicated that the types of logic operations include: true logic operation, false logic operation, P logic operation, Q logic operation, not-P logic operation, not-Q logic operation, AND logic operation, NAND logic operation, OR logic operation, NOR logic operation, material implication logic operation, inverse material implication logic operation, negative material implication logic operation, inverse negative material implication logic operation, XOR logic operation, and XNOR logic operation. As shown in FIG. 3, when the type of logic operation is true logic operation, the value of voltage A is $-V_p$, and the value of voltage C is $-V_p$. When the type of logic operation is false logic operation, the value of voltage A is 0, and the value of voltage C is 0. When the type of logic operation is P logic operation, the value of voltage A is $-V$, and the value of voltage C is $-V$. When the type of logic operation is Q logic operation, the value of voltage A is $-V_p$, and the value of voltage C is 0. When the type of logic operation is not-P logic operation, the value of voltage A is $V-V_p$, and the value of voltage C is $V-V_p$. When the type of logic operation is not-Q logic operation, the value of voltage A is 0, and the value of voltage C is $-V_p$. When the type of logic operation is AND logic operation, the value of voltage A is $-V$, and the value of voltage C is 0. When the type of logic operation is NAND logic operation, the value of voltage A is $V-V_p$, and the value of voltage C is $-V_p$. When the type of logic operation is OR logic operation, the value of voltage A is $-V_p$, and the value of voltage C is $-V$. When the type of logic operation is NOR logic operation, the value of voltage A is 0, and the value of voltage C is $V-V_p$. When the type of the logic operation is material implication logic operation, the value of voltage A is $-V_p$, and the value of voltage C is $V-V_p$. When the type of logic operation is inverse material implication logic operation, the value of voltage A is $-V$, and the value of voltage C is $-V_p$. When the type of logic operation is negative material implication logic operation, the value of voltage A is 0, and the value of voltage C is $-V$. When the type of logic operation is inverse negative material implication logic operation, the value of voltage A is $V-V_p$, and the value of voltage C is 0. When the type of logic operation is XOR logic operation, the value of voltage A is $V-V_p$, and the value of voltage C is $-V$. When the type of logic operation is XNOR operation, the value of voltage A is $-V$, and the value of voltage C is $V-V_p$. Specifically, when the logic value P is 0, the value of V is 0; when the logic value P is 1, the value of V is $V_p$.

The present disclosure provides a non-volatile Boolean logic circuit. In a logic operation, the input logic value P is defined in the form of voltage at the control terminal $T_1$ and the control terminal $T_3$. The input logic value Q is defined as the resistance state of the memristor $M_1$, and the resistance state of the memristor $M_2$ is used as the output. It is only required to set the memristor and bias the memristor and the resistor in two steps to completely achieve 16 types of Boolean logic functions. In this manner, the operation is simple, fewer devices are required in the circuit, the circuit area is smaller, and the operation efficiency is higher.

Embodiment 2

Figure 4:
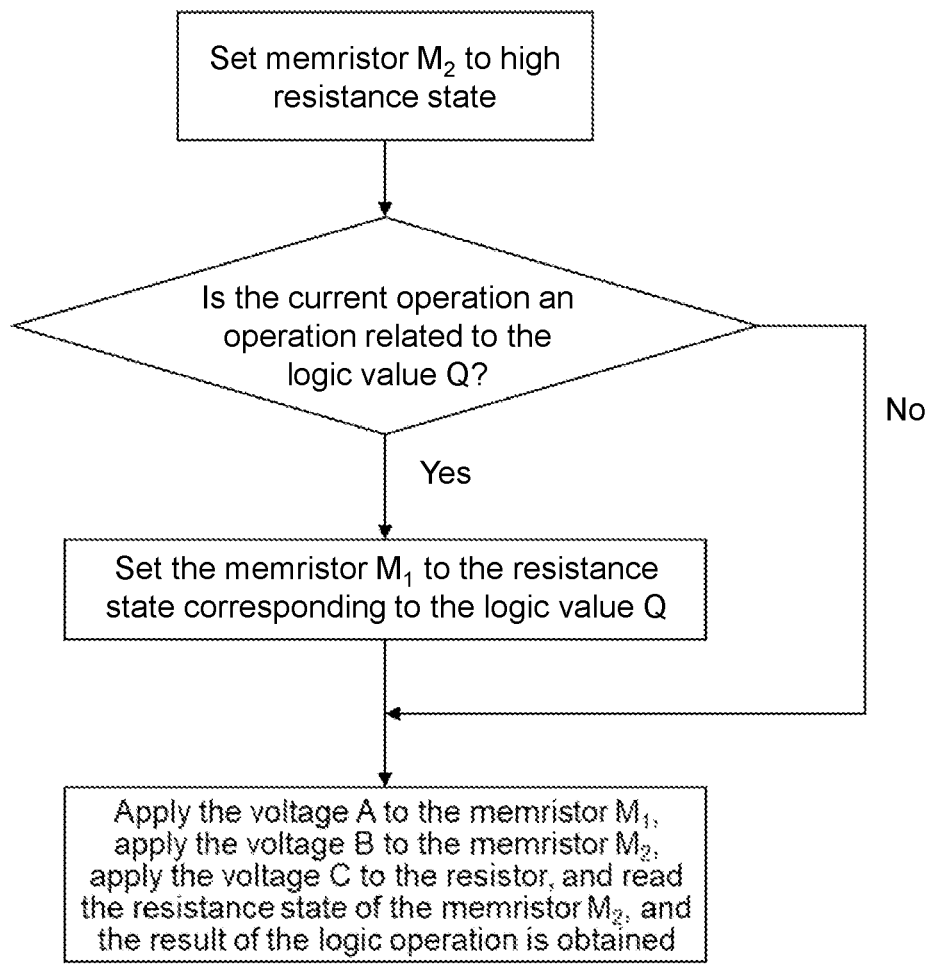
FIG. 4 is a flowchart of an operation method in Embodiment 2 of the present disclosure based on the non-volatile Boolean logic circuit of Embodiment 1.

An operation method based on the non-volatile Boolean logic circuit in Embodiment 1, as shown in FIG. 4, includes the following steps.

S1. Setting the memristor $M_2$ to a high resistance state;

S2. Determining whether the current operation is an operation related to the logic value Q, and if so, setting the memristor $M_1$ to the resistance state corresponding to the logic value Q; and the operation related to the logic value Q includes performing logic operations on the logic value P and the logic value Q and performing logic operation only on the logic value Q;

S3. Applying a voltage A to the memristor $M_1$, applying a voltage B to the memristor $M_2$, applying a voltage C to the resistor, and reading a resistance state of the memristor $M_2$, thereby obtaining the result of the logic operation.

The value of voltage A and voltage C is determined based on the logic value P and the type of logic operation. The value of voltage B is $V_p$; $V_p$ satisfies $V_{set}/2 < V_p < V_{set}$ and $V_p < 2|V_{reset}|$; $V_{set}$ is a threshold value at which the memristor $M_1$ or the memristor $M_2$ changes from a high resistance state to a low resistance state; $V_{reset}$ is a threshold value at which the memristor $M_1$ or the memristor $M_2$ changes from a low resistance state to a high resistance state.

The above operation method may realize 16 types of Boolean logic functions based on two bipolar memristors, and for different types of logic operation (in this embodiment, applying voltage A to the memristor $M_1$ is applying voltage A to the control terminal $T_1$, and applying voltage C to the resistor is applying voltage C to the control terminal $T_3$), the detailed operation is as follows.

True logic (TRUE): the value of voltage A is $-V_p$, and the value of voltage C is $-V_p$; under the circumstances, $-V_p$ is applied to the control terminals $T_1$ and $T_3$, and the resistance state of the memristor $M_1$ is used as the input Q.

False logic (FALSE): the value of voltage A is 0, and the value of voltage C is 0; under the circumstances, the control terminals $T_1$ and $T_3$ are grounded, and the resistance state of the memristor $M_1$ is used as the input Q.

P logic (COPY P): the value of voltage A is $-V$, and the value of voltage C is $-V$; under the circumstances, the input P is applied to the terminals $T_1$ and $T_3$ in the form of the voltage $-V$, and the resistance state of the memristor $M_1$ is used as the input Q.

Q logic (COPY Q): the value of voltage A is $-V_p$, and the value of voltage C is 0; under the circumstances, $-V_p$ is applied to the control terminal $T_1$, the control terminal $T_3$ is grounded, and the resistance state of the memristor $M_1$ is used as the input Q.

Not-P logic (NOT P): the value of voltage A is $V-V_p$, and the value of voltage C is $V-V_p$; under the circumstances, the input P is applied to the terminals $T_1$ and $T_3$ in the form of the voltage $V-V_p$, and the resistance state of the memristor $M_1$ is used as the input Q.

Not-Q logic (NOT Q): the value of voltage A is 0, and the value of voltage C is $-V_p$; under the circumstances, the control terminal $T_1$ is grounded, and $-V_p$ is applied to the control terminal $T_3$, and the resistance state of the memristor $M_1$ is used as the input Q.

AND logic (AND): the value of voltage A is $-V$, and the value of voltage C is 0; under the circumstances, the input P is applied to the terminal $T_1$ in the form of a voltage $-V$, the control terminal $T_3$ is grounded, and the resistance state of the memristor $M_1$ is used as the input Q.

NAND logic (NAND): the value of voltage A is $V-V_p$, and the value of voltage C is $-V_p$; under the circumstances, the input P is applied to the terminal $T_1$ in the form of the voltage $V-V_p$, and $-V_p$ is applied to the control terminal $T_3$, and the resistance state of the memristor $M_1$ is used as the input Q.

OR logic (OR): the value of voltage A is $-V_p$, and the value of voltage C is $-V$; under the circumstances, $-V_p$ is applied to the control terminal $T_1$, the input P is applied to the terminal $T_3$ in the form of a voltage $-V$, and the resistance state of the memristor $M_1$ is used as the input Q.

NOR logic (NOR): the value of voltage A is 0, and the value of voltage C is $V-V_p$; under the circumstances, the control terminal $T_1$ is grounded, the input P is applied to the terminal $T_3$ in the form of the voltage $V-V_p$, and the resistance state of the memristor $M_1$ is used as the input Q.

Material implication logic (IMP): the value of voltage A is $-V_p$, and the value of voltage C is $V-V_p$; under the circumstances, $-V_p$ is applied to the control terminal $T_1$, and the input P is applied to the terminal $T_3$ in the form of the voltage $V-V_p$, and the resistance state of the memristor $M_1$ is used as the input Q.

Inverse material implication logic (RIMP): the value of voltage A is $-V$, and the value of voltage C is $-V_p$; under the circumstances, the input P is applied to the terminal $T_1$ in the form of a voltage $-V$, and $-V_p$ is applied to the control terminal $T_3$, and the resistance state of the memristor $M_1$ is used as the input Q.

Negative material implication logic (NIMP): the value of voltage A is 0, and the value of voltage C is $-V$; under the circumstances, the control terminal $T_1$ is grounded, the input P is applied to the terminal $T_3$ in the form of voltage $-V$, and the resistance state of the memristor $M_1$ is used as the input Q.

Inverse negative material implication logic (RNIMP): the value of voltage A is $V-V_p$, and the value of voltage C is 0; under the circumstances, the input P is applied to the terminal $T_1$ in the form of the voltage $V-V_p$, the control terminal $T_3$ is grounded, and the resistance state of the memristor $M_1$ is used as the input Q.

XOR logic (XOR): the value of voltage A is $V-V_p$, and the value of voltage C is $-V$; under the circumstances, the input P is applied to the terminal $T_1$ in the form of the voltage $V-V_p$, and the input P is applied to the terminal $T_3$ in the form of the voltage $-V$, and the resistance state of the memristor $M_1$ is used as the input Q.

XNOR logic (XNOR): the value of voltage A is $-V$, and the value of voltage C is $V-V_p$; under the circumstances, the input P is applied to the terminal $T_1$ in the form of the voltage $-V$, the input P is applied to the terminal $T_3$ in the form of the voltage $V-V_p$, and the resistance state of the memristor $M_1$ is used as the input Q.

When the logic value P is 0, the value of V is 0; when the logic value P is 1, the value of V is $V_p$.

It should be noted that for logic operations such as P logic operation and true logic operation, although the operation result has nothing to do with the input Q, Q is also involved in the operation (see the truth table of the detailed logic operation), so the operation also belongs to the operation of performing logic operations on logic value P and logic value Q.

In order to further illustrate the operation method provided by the present disclosure, the following takes the XOR logic operation as an example for description in detail; the detailed operation is as follows.

The initial state of the memristor $M_2$ is a high resistance state.

When the input P=0 and Q=0, V=0, the memristor $M_1$ is set to a high resistance state. Under the circumstances, the voltage $V_{M1}$ at both ends of the memristor $M_1$ is about $-V_p$, and the voltage $V_{M2}$ at both ends of the memristor $M_2$ is about $V_p$. Since $V_{set}/2 < V_p < V_{set}$ and $V_p < 2|V_{reset}|$ the memristor $M_2$ maintains at the high resistance state without change under the circumstances, and outputs a logic value of 0, that is, the result of the logic operation is 0.

When input P=0 and Q=1, V=0, the memristor $M_1$ is set to a low resistance state. Under the circumstances, the voltage $V_{M1}$ at both ends of the memristor $M_1$ is about 0, and the voltage $V_{M2}$ at both ends of the memristor $M_2$ is about $2V_p$. Under the circumstances, the memristor $M_2$ is changed into a low resistance state, and outputs a logic value of 1, that is, the result of the logic operation is 1.

When the input P=1 and Q=0, $V=V_p$, the memristor $M_1$ is set to a high resistance state. Under the circumstances, the voltage $V_{M1}$ at both ends of the memristor $M_1$ is about $V_p$, and the voltage $V_{M2}$ at both ends of the memristor $M_2$ is about $2V_p$, the memristor $M_2$ is changed into a low resistance state, and outputs a logic value of 1, that is, the result of the logic operation is 1.

When the input P=1 and Q=1, $V=V_p$, the memristor $M_1$ is set to a low resistance state. Under the circumstances, the voltage $V_{M1}$ at both ends of the memristor $M_1$ is about 0, and the voltage $V_{M2}$ at both ends of the memristor $M_2$ is about $V_p$, the memristor $M_2$ maintains to be at a high resistance state without change, and outputs a logic value of 0.

Figure 5:
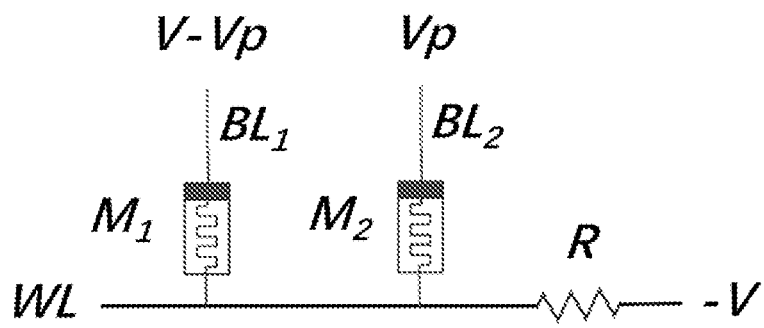
FIG. 5 is an XOR logic operation circuit diagram in Embodiment 2 of the present disclosure.
Figures 6, 7:
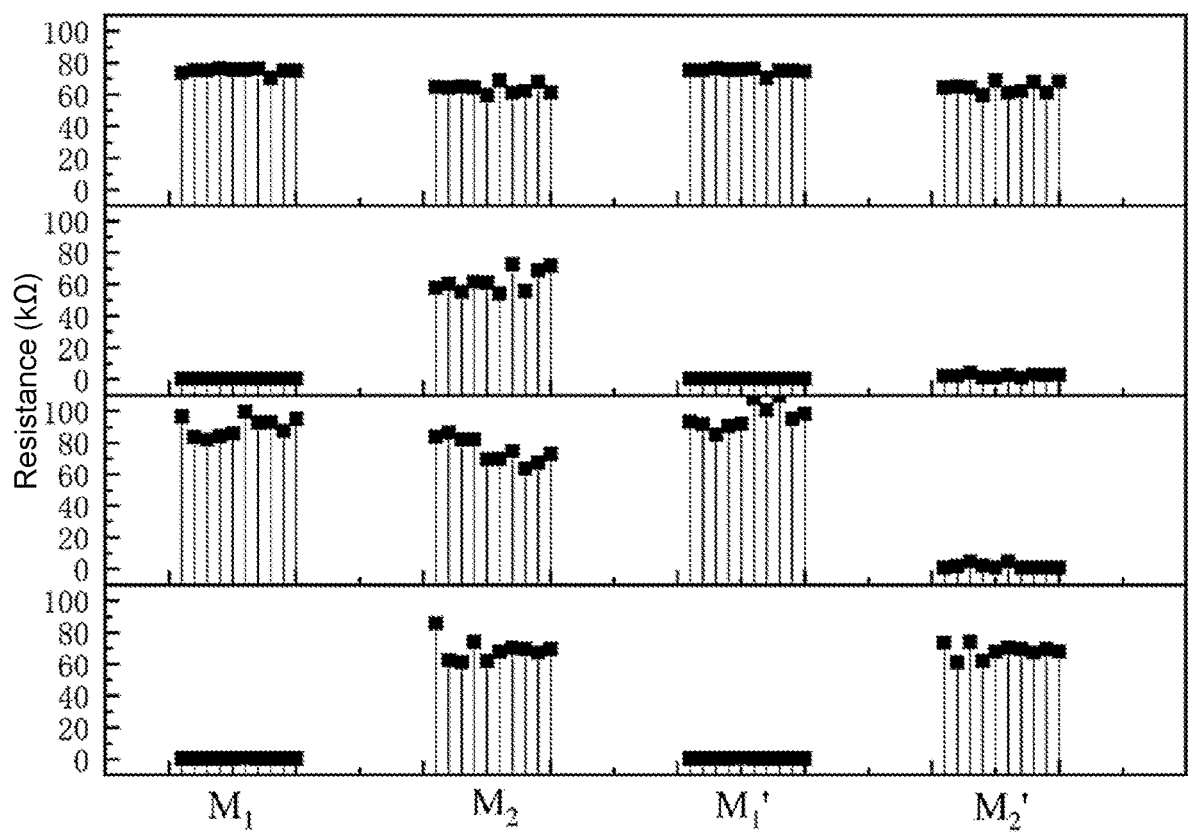
FIG. 6 is a truth table of an XOR logic operation in Embodiment 2 of the present disclosure.
FIG. 7 is a schematic diagram showing the comparison results of resistance state changes measured before and after the XOR logic operation based on the XOR logic operation circuit diagram provided in Embodiment 2 of the present disclosure.

This embodiment provides the resistance changes measured in the actual circuit under four input conditions of the XOR logic operation, and 10 tests are performed for each input condition. In this embodiment, the value of the resistance R is 10 KΩ, and the on/off ratio of the memristor is greater than 100, so that the resistance values of the memristor in the low resistance state, the high resistance state and the resistance value R of the fixed-value resistor may be clearly distinguished. Specifically, FIG. 5 shows the XOR logic operation circuit diagram, FIG. 6 shows a truth table of XOR logic operation, FIG. 7 shows comparison results of resistance state changes measured before and after the XOR logic operation on the XOR logic operation circuit diagram. The ordinate corresponding to $M_1$ and $M_2$ represents the resistance states of memristor $M_1$ and memristor $M_2$ before operation; the ordinate corresponding to $M_1'$ and $M_2'$ represents the resistance states of the memristor $M_1$ and the memristor $M_2$ after operation. As can be seen from the figure, the XOR logic operation method provided by the present disclosure may effectively control the logic input and output according to the truth table of XOR logic operation.

It should be noted that the operation process of other Boolean logic operations is similar to the operation process of the XOR logic operation, and the details are not repeated here.

The present disclosure operates a logic circuit composed of a memristor and a fixed-value resistor, and 16 types of integrated logic operation may be realized by setting the memristor and configuring different operating voltages at the control terminal in two steps. The present disclosure has the advantages of using fewer devices and performing fewer operation steps, the logic cascade is simple, and no damage to the input information Therefore, the disclosure may be used as a universal logic operation implementation method.

Embodiment 3

A logic cascading method based on the non-volatile Boolean logic circuit described in Embodiment 1 includes the following steps.

The previous logic operation result obtained by the operation method described in Embodiment 2 is taken as a new input logic value Q, the operation is performed again according to the operation method described in Embodiment 2, thereby realizing the logic cascade.

In this embodiment, the output of the previous logic operation is stored in the memristor $M_2$ in the form of a resistive state, and the result obtained from the previous logic operation is directly used as the input of the subsequent logic operation, that is, the memristor $M_2$ which stores the operation result in the previous step is directly regarded as the input memristor $M_1$ of the subsequent logic operation.

In summary, the present disclosure discloses a non-volatile Boolean logic circuit based on memristors and an operation method. The logic circuit includes two memristors and a fixed-value resistor. With two operation steps, including setting the memristors and configuring two control terminals ($T_1$, $T_3$) of the circuit, it is possible to realize completely 16 types of Boolean logic functions. The positive electrodes of the memristor $M_1$ and the memristor $M_2$ are connected to different bit lines ($BL_1$, $BL_2$), and the negative electrodes of the memristor $M_1$ and the memristor $M_2$ are connected to the same word line (WL); one end of the fixed-value resistor is connected to the word line, and the other end is connected to the control terminal $T_3$. In the logic operation, one input logic value P is defined in the form of voltage at the control terminals $T_1$ and $T_3$, and the other input logic value Q is defined as the resistance state of the memristor $M_1$, and the resistance state of the memristor $M_2$ is used as the output. Compared with the existing logic method, the solution of the present disclosure adopts fewer operation steps and fewer devices, which improves the operation efficiency and saves the circuit area. Moreover, the proposed logic implementation method is non-destructive, which helps to protect the integrity of the input information. In addition, the logic cascade of this scheme is simple and easy to implement, which is helpful to realize more complex logic functions.

Those skilled in the art can easily understand that the above descriptions are only preferred embodiments of the present disclosure, and are not intended to limit the present disclosure. Any modifications, equivalent replacements and improvements made within the spirit and principles of the present disclosure, and so on should be included within the scope to be protected by the present disclosure.

What is claimed is:

1. A non-volatile Boolean logic circuit based on memristors, the non-volatile Boolean logic circuit being used to perform logic operations on an input logic value P and/or an input logic value Q;
   the non-volatile Boolean logic circuit comprising a controller, a memristor $M_1$, a memristor $M_2$ and a resistor, wherein the controller is connected to a positive electrode of the memristor $M_1$, a positive electrode of the memristor $M_2$, and one end of the resistor, respectively, wherein negative electrodes of the memristor $M_1$ and the memristor $M_2$ are connected to a same word line, another end of the resistor is connected to the word line, wherein the memristor $M_1$ and the memristor $M_2$ have the same structure,
   wherein the controller is used to set the memristor $M_2$ to a high resistance state before performing the logic operations, wherein when performing the logic operations, a voltage A is applied to the memristor $M_1$, a voltage B is applied to the memristor $M_2$, a voltage C is applied to the resistor, and a resistance state of the memristor $M_2$ is read, thereby obtaining a result of the logic operations;
   wherein when the non-volatile Boolean logic circuit performs operations related to the logic value Q, the controller is further used to set the memristor $M_1$ to a resistance state corresponding to the logic value Q before performing the logic operations, wherein the operations related to the logic value Q comprise performing the logic operations on the logic value P and the logic value Q and performing a logic operation only on the logic value Q;

wherein values of the voltage A and the voltage C are determined based on the logic value P and a type of the logic operation, wherein a value of the voltage B is $V_p$, wherein the $V_p$ satisfies $V_{set}/2<V_p<V_{set}$ and $V_p<2|V_{reset}|$, wherein the $V_{set}$ is a threshold value at which the memristor $M_1$ or the memristor $M_2$ changes from the high resistance state to a low resistance state, wherein the $V_{reset}$ is a threshold value at which the memristor $M_1$ or the memristor $M_2$ changes from the low resistance state to the high resistance state.

2. The non-volatile Boolean logic circuit according to claim 1, wherein the memristor M1 and the memristor M2 both comprise the high resistance state and the low resistance state; the high resistance state corresponds to a logic value "0", and the low resistance state corresponds to a logic value "1".

3. The non-volatile Boolean logic circuit according to claim 2, wherein a resistance value of the resistor is in a range between resistance values of the memristor $M_1$ or the memristor $M_2$ in the high resistance state and the low resistance state; the resistance value of the resistor is $R=\sqrt{R_H*R_L}$, wherein $R_H$ is statistical average resistance values of the memristor $M_1$ and the memristor $M_2$ in the high resistance state, and $R_L$ is statistical average resistance values of the memristor $M_1$ and the memristor $M_2$ in the low resistance state.

4. The non-volatile Boolean logic circuit according to claim 2, wherein the controller comprises a control terminal $T_1$, a control terminal $T_2$ and a control terminal $T_3$, wherein the control terminal $T_1$ is connected to the positive electrode of the memristor $M_1$, the control terminal $T_2$ is connected to the positive electrode of the memristor $M_2$, and the control terminal $T_3$ is connected to the one end of the resistor;

wherein when the controller performs the logic operations, the voltage A is applied to the memristor $M_1$ through the control terminal $T_1$, the voltage B is applied to the memristor $M_2$ through the control terminal $T_2$, the voltage C is applied to the resistor through the control terminal $T_3$, and the resistance state of the memristor $M_2$ is read, thereby obtaining the result of the logic operation.

5. The non-volatile Boolean logic circuit according to claim 1, wherein the types of the logic operations comprise: a true logic operation, a false logic operation, a P logic operation, a Q logic operation, a not-P logic operation, a not-Q logic operation, an AND logic operation, an NAND logic operation, an OR logic operation, an NOR logic operation, a material implication logic operation, an inverse material implication logic operation, a negative material implication logic operation, an inverse negative material implication logic operation, an XOR logic operation, and an XNOR logic operation.

6. The non-volatile Boolean logic circuit according to claim 5, wherein
when the type of the logic operation is the true logic operation, the value of the voltage A is $-V_p$, and the value of the voltage C is $-V_p$;
when the type of the logic operation is the false logic operation, the value of the voltage A is 0, and the value of the voltage C is 0;
when the type of the logic operation is the P logic operation, the value of the voltage A is $-V$, and the value of the voltage C is $-V$;
when the type of the logic operation is the Q logic operation, the value of the voltage A is $-V_p$, and the value of the voltage C is 0;
when the type of the logic operation is the not-P logic operation, the value of the voltage A is $V-V_p$, and the value of the voltage C is $V-V_p$;
when the type of the logic operation is the not-Q logic operation, the value of the voltage A is 0, and the value of the voltage C is $-V_p$;
when the type of the logic operation is the AND logic operation, the value of the voltage A is $-V$, and the value of the voltage C is 0;
when the type of the logic operation is the NAND logic operation, the value of the voltage A is $V-V_p$, and the value of the voltage C is $-V_p$;
when the type of the logic operation is the OR logic operation, the value of the voltage A is $-V_p$, and the value of the voltage C is $-V$;
when the type of the logic operation is the NOR logic operation, the value of the voltage A is 0, and the value of the voltage C is $V-V_p$;
when the type of the logic operation is the material implication logic operation, the value of the voltage A is $-V_p$, and the value of the voltage C is $V-V_p$;
when the type of the logic operation is the inverse material implication logic operation, the value of the voltage A is $-V$, and the value of the voltage C is $-V_p$;
when the type of the logic operation is the negative material implication logic operation, the value of the voltage A is 0, and the value of the voltage C is $-V$;
when the type of the logic operation is the inverse negative material implication logic operation, the value of the voltage A is $V-V_p$, and the value of the voltage C is 0;
when the type of the logic operation is the XOR logic operation, the value of the voltage A is $V-V_p$, and the value of the voltage C is $-V$;
when the type of the logic operation is the XNOR operation, the value of the voltage A is $-V$, and the value of the voltage C is $V-V_p$;
when the logic value P is 0, the value of V is 0; when the logic value P is 1, the value of V is $V_p$.

7. An operation method based on the non-volatile Boolean logic circuit according to claim 1, comprising following steps:
S1. setting the memristor $M_2$ to the high resistance state;
S2. determining whether a current operation is the operation related to the logic value Q, and if so, setting the memristor $M_1$ to the resistance state corresponding to the logic value Q; and the operation related to the logic value Q comprises performing the logic operations on the logic value P and the logic value Q and performing the logic operation only on the logic value Q;
S3. applying the voltage A to the memristor $M_1$, applying the voltage B to the memristor $M_2$, applying the voltage C to the resistor, and reading the resistance state of the memristor $M_2$, thereby obtaining the result of the logic operation;
wherein the values of the voltage A and the voltage C are determined based on the logic value P and the type of the logic operation; the value of the voltage B is $V_p$; the $V_p$ satisfies $V_{set}/2<V_p<V_{set}$ and $V_p<2|V_{reset}|$; the $V_{set}$ the threshold value at which the memristor $M_1$ or the memristor $M_2$ changes from the high resistance state to the low resistance state; the $V_{reset}$ is the threshold value at which the memristor $M_1$ or the memristor $M_2$ changes from the low resistance state to the high resistance state.

8. The operation method according to claim 7, wherein when the type of the logic operation is the true logic operation, the value of the voltage A is $-V_p$, and the value of the voltage C is $-V_p$;

when the type of the logic operation is the false logic operation, the value of the voltage A is 0, and the value of the voltage C is 0;

when the type of the logic operation is the P logic operation, the value of the voltage A is $-V$, and the value of the voltage C is $-V$;

when the type of the logic operation is the Q logic operation, the value of the voltage A is $-V_p$, and the value of the voltage C is 0;

when the type of the logic operation is the not-P logic operation, the value of the voltage A is $V-V_p$, and the value of the voltage C is $V-V_p$;

when the type of the logic operation is the not-Q logic operation, the value of the voltage A is 0, and the value of the voltage C is $-V_p$;

when the type of the logic operation is the AND logic operation, the value of the voltage A is $-V$, and the value of the voltage C is 0;

when the type of the logic operation is the NAND logic operation, the value of the voltage A is $V-V_p$, and the value of the voltage C is $-V_p$;

when the type of the logic operation is the OR logic operation, the value of the voltage A is $-V_p$, and the value of the voltage C is $-V$;

when the type of the logic operation is the NOR logic operation, the value of the voltage A is 0, and the value of the voltage C is $V-V_p$;

when the type of the logic operation is the material implication logic operation, the value of the voltage A is $-V_p$, and the value of the voltage C is $V-V_p$;

when the type of the logic operation is the inverse material implication logic operation, the value of the voltage A is $-V$, and the value of the voltage C is $-V_p$;

when the type of the logic operation is the negative material implication logic operation, the value of the voltage A is 0, and the value of the voltage C is $-V$;

when the type of the logic operation is the inverse negative material implication logic operation, the value of the voltage A is $V-V_p$, and the value of the voltage C is 0;

when the type of the logic operation is the XOR logic operation, the value of the voltage A is $V-V_p$, and the value of the voltage C is $-V$;

when the type of the logic operation is the XNOR operation, the value of the voltage A is $-V$, and the value of the voltage C is $V-V_p$;

when the logic value P is 0, the value of V is 0; when the logic value P is 1, the value of V is $V_p$.

9. A logic cascading method based on a non-volatile Boolean logic circuit, comprising:

taking a previous logic operation result obtained by the operation method described in claim 7 as a new input logic value Q, the operation is performed again according to the operation method described in claim 7, thereby realizing a logic cascade, wherein the non-volatile Boolean logic circuit comprising a controller, a memristor $M_1$, a memristor $M_2$ and a resistor, wherein the controller is connected to a positive electrode of the memristor $M_1$, a positive electrode of the memristor $M_2$, and one end of the resistor, respectively, wherein negative electrodes of the memristor $M_1$ and the memristor $M_2$ are connected to a same word line, another end of the resistor is connected to the word line, wherein the memristor $M_1$ and the memristor $M_2$ have the same structure, wherein the controller is used to set the memristor $M_2$ to a high resistance state before performing logic operations, wherein when performing the logic operations, a voltage A is applied to the memristor $M_1$, a voltage B is applied to the memristor $M_2$, a voltage C is applied to the resistor, and a resistance state of the memristor $M_2$ is read thereby obtaining a result of the logic operations;

wherein when the non-volatile Boolean logic circuit performs operations related to a logic value Q, the controller is further used to set the memristor $M_1$ to a resistance state corresponding to the logic value Q before performing the logic operations, wherein the operations related to the logic value Q comprise performing logic operations on a logic value P and the logic value Q and performing a logic operation only on the logic value Q, wherein values of the voltage A and the voltage C are determined based on the logic value P and a type of the logic operation, wherein a value of the voltage B is $V_p$, wherein the $V_p$ satisfies $V_{set}/2<V_p<V_{se}$ and $V_p<2|V_{reset}|$, wherein the $V_{set}$ is a threshold value at which the memristor $M_1$ or the memristor $M_2$ changes from the high resistance state to a low resistance state, wherein the $V_{reset}$ is a threshold value at which the memristor $M_1$ or the memristor $M_2$ changes from the low resistance state to the high resistance state.

* * * * *